US012687584B2

(12) United States Patent
Secouard et al.

(10) Patent No.: US 12,687,584 B2
(45) Date of Patent: Jul. 21, 2026

(54) METHOD FOR SORTING A SET OF BATTERIES BASED ON A MACHINE CLASSIFICATION MODEL

(71) Applicant: COMMISSARIAT A L'ENERGIE ATOMIQUE ET AUX ENERGIES ALTERNATIVES, Paris (FR)

(72) Inventors: Christophe Secouard, Grenoble (FR); Sami Oukassi, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 633 days.

(21) Appl. No.: 18/127,553

(22) Filed: Mar. 28, 2023

(65) Prior Publication Data

US 2023/0314527 A1 Oct. 5, 2023

(30) Foreign Application Priority Data

Mar. 31, 2022 (FR) ...................................... 2202945

(51) Int. Cl.
| | |
|---|---|
| *G06F 11/30* | (2006.01) |
| *G01R 31/367* | (2019.01) |
| *G01R 31/3835* | (2019.01) |
| *G01R 31/392* | (2019.01) |

(52) U.S. Cl.
CPC ......... *G01R 31/392* (2019.01); *G01R 31/367* (2019.01); *G01R 31/3835* (2019.01)

(58) Field of Classification Search
CPC .................................................. G01R 31/392
See application file for complete search history.

(56) References Cited

U.S. PATENT DOCUMENTS

| | | | |
|---|---|---|---|
| 6,526,361 B1 | 2/2003 | Jones et al. | |
| 9,209,496 B2 | 12/2015 | Ro | |
| (Continued) | | | |

FOREIGN PATENT DOCUMENTS

| | | | | |
|---|---|---|---|---|
| FR | 3 112 213 A1 | 1/2022 | | |
| WO | 2019/046555 A1 | 3/2019 | | |
| WO | WO-2021189146 A1 * | 9/2021 | ......... | G01R 1/06788 |

OTHER PUBLICATIONS

Neudecker, et al., "Lithium-Free Thin-Film Battery with In Situ Plated Li Anode", Journal of the Electrochemical Society, vol. 147 (2), pp. 517-523, 2000.

*Primary Examiner* — Phuong Huynh
(74) *Attorney, Agent, or Firm* — BakerHostetler

(57) ABSTRACT

A computer-implemented method for the machine learning of a model for classifying batteries into two categories: functional or defective, the method comprising the following steps: acquiring, on a set of batteries of the same type, a group of measurements characteristic of the operation of a battery, carrying out complete cycling of each battery of the set and measuring at least one curve from among a charge curve or a discharge curve of the battery, determining, for each battery, a label of belonging to the functional or defective category by comparing at least one measured curve with a reference curve characterizing the correct operation of the battery, and carrying out supervised training of a model for classifying a battery according to the two categories based on the groups of measurements and on the label of belonging to one of the two categories.

16 Claims, 11 Drawing Sheets

(56) References Cited

U.S. PATENT DOCUMENTS

2010/0312733 A1*  12/2010  Song ..................... H01M 10/48
                                              702/63
2019/0072618 A1*   3/2019  Ghantous ............. G01R 31/392
2022/0003821 A1*   1/2022  Toffoli ............... G01R 31/3835

* cited by examiner

FIG.6

METHOD FOR SORTING A SET OF BATTERIES BASED ON A MACHINE CLASSIFICATION MODEL

CROSS-REFERENCE TO RELATED APPLICATION

This application claims priority to foreign French patent application No. FR 2202945, filed on Mar. 31, 2022, the disclosure of which is incorporated by reference in its entirety.

FIELD OF THE INVENTION

The invention relates to the field of methods for electrically testing energy storage devices, commonly called batteries or microbatteries, in the course of or at the end of the manufacture thereof with a view to sorting and eliminating non-compliant products.

BACKGROUND

A microbattery is produced by successively depositing the following elements on a substrate: (i) a first current collector, (ii) a first electrode, (iii) an electrolyte layer, (iv) a second electrode, and (v) a second current collector. Encapsulation by way of depositing additional layers, or by adding a cover, is necessary in order to protect the device from chemical reactivity with oxygen and water vapour.

A microbattery is thus composed essentially of two electrodes (a positive electrode and a negative electrode) that are separated by an electrical insulator and an ion conductor (the electrolyte), and in which the ions (for example lithium ions, $Li^+$) travel from one electrode to the other depending on whether the microbattery is being charged or discharged.

For example, a solid-state microbattery may be defined as a battery that has all of the following characteristics:

All of the active layers (that is to say the positive electrode, the electrolyte and the negative electrode) consist solely of solid-state inorganic material. As a general rule, this means that there is no liquid or gel polymer electrolyte and no electrode material that contains polymeric binders, as is the case in "standard batteries".

The individual thickness of all of the active layers (that is to say the positive electrode, the electrolyte and the negative electrode) is less than 50 μm. In addition, the thickness of the electrolyte is generally less than 5 μm, and For standard batteries, the thickness of each layer is generally greater than 100 μm. The surface area dimensions generally vary from $mm^2$ to 10 $cm^2$.

Generally speaking, microbatteries may be classified into three categories based on the type of negative electrode (or anode), often deposited on the electrolyte:

anode made of Lit-ion storage material: this often involves transition metal oxides (Vox, TiOx, NiOx, etc.) or carbon group materials (Si, Ge, C or mixtures);

anode made of lithium metal: a lithium layer is deposited in metal form on the collector; and anode made of metal inert to lithium: this configuration is often called "Li-free" with reference to the article *J. Electrochem. Soc.*-2000-Neudecker-517-23. In the latter case, an anode made of lithium metal is formed when the battery is first charged through the electrodeposition of Li+ ions (from the cathode) between the electrolyte and the second current collector.

Thus, in lithium-free or "Li-free" microbatteries, there is no negative electrode at the end of the manufacturing process. Said negative electrode is created in the course of the first charge.

Microbatteries are generally used in various fields of application (Internet of Things, medical implants, autonomous sensors, etc.) that require the production of high-energy-density submillimetre-size components. The manufacturing techniques involved, originating from microelectronics (silicon wafer substrate, depositing thin layers, photolithography, dry/wet etching), make it possible to produce a large number of microbatteries at a time, of the order of several tens of thousands on a single substrate, it being necessary to check the correct operation of said microbatteries.

Indeed, at the end of the manufacturing process, some defects may exist on certain components and it is therefore imperative to test them one by one before considering them to be operational.

The simplest and most direct method for sorting microbatteries at the end of manufacture thereof consists in performing multiple charging/discharging cycles and then checking that the current profiles, voltage profiles, and the capacity and internal resistance values are compliant with what is expected.

However, this approach comprises numerous drawbacks. With several hours, or even days needed per device, the test time involved is too long for this process to be viable in an industrial context, all the more so given the number of devices involved in the targeted applications.

Moreover, completely cycling the batteries leads to modification of the crystalline structure of the stack, ageing of the interfaces, and migration of Li+ ions, thereby making the devices extremely sensitive to humidity and the ambient atmosphere and possibly preventing the remaining processes from being able to be continued if this test is carried out during manufacture. Finally, the tested batteries are no longer marketable, given that the ageing of the component has already been initiated.

The prior art comprises various exemplary methods for sorting batteries or microbatteries based on fast tests.

American U.S. Pat. No. 9,209,496 proposes a sorting method consisting in measuring the open-circuit voltage (OCV) of a battery, in discharging it for a certain period and comparing the end-of-discharge potential to the OCV potential. It is clear that, in this case of "Li-free" microbatteries, this sorting method is not suitable in that (i) the OCV does not provide any indications regarding the state of the battery, and (ii) discharging "Li-free" batteries does not make it possible to modify their potential in a stable manner in that the microbattery is completely discharged at the time of the test.

American U.S. Pat. No. 6,526,361 proposes a sorting method consisting in applying multiple successive pulses (applying either current pulses or voltage pulses), with a relaxation period between each pulse, to batteries, in measuring the associated voltage response and in performing sorting on the basis of this response. This approach is not applicable to "Li-free" microbatteries, given that it requires a stable initial voltage state.

French patent application FR3112213 by the Applicant proposes to bridge the gaps between the above two methods by forming a nanometre layer of lithium by way of a charge by applying a brief current. This makes it possible to have a stable state of the interfaces and to utilize the potential response on Li-free architectures, while not degrading the batteries. Nevertheless, the proposed solution does not address the case of potential loading. Moreover, the sorting is carried out in successive steps using a system of screens that requires thresholds to be defined: if the variables measured in a given step (such as potential, resistance) are not within a given interval, the measurement stops and the battery is considered to be defective. Furthermore, defining precise thresholds, based on the knowledge of a person skilled in the art, is often tricky and inaccurate, especially when the number of variables is high, and using screens is not able to cover all possible combinations, at the risk of eliminating functional components.

SUMMARY OF THE INVENTION

The present invention aims to overcome the drawbacks of the methods from the prior art by proposing a fast testing method that does not damage the batteries and that makes it possible to sort the batteries according to which ones are functional or defective. The invention is based on training a machine learning classification model based on measurements taken on a set of batteries. The trained classification model is then used to sort the batteries at the end of manufacture thereof simply based on measurements carried out on the batteries, without the need to carry out cycling (charging and then discharging) of the battery.

Training the classification model involves partially charging the components by applying a voltage for a duration of the order of a minute and then studying the relaxation of the potential. This has the advantage of loading the battery in the same way as during final use, without however creating an excessively thick layer of lithium metal that could lead to degradation.

The invention comprises two phases. In the first phase, called development phase, a sample of batteries tested according to a fast protocol is then cycled completely and the components are classified into two categories: functional or defective. The learning algorithm is trained on these data, so as to be able to predict, at output, the functional or non-functional character of the devices, with the measurements carried out during the fast test at input.

In the second phase, called use phase, once the model has been validated, new batteries are tested and the trained classification model makes it possible to predict the functionality thereof without having to cycle them. This approach has the advantage of being able to dispense with defining thresholds for the sorting and of accommodating a large number of dimensions.

The invention is advantageously applicable to testing "Li-free" solid batteries, but its principle is applicable more generally to any type of batteries or microbatteries.

One subject of the invention is a computer-implemented method for the machine learning of a model for classifying batteries into two categories: functional or defective, the method comprising the following steps:

Acquiring, on a set of batteries of the same type, a group of measurements characteristic of the operation of a battery, Carrying out complete cycling of each battery of said set and measuring at least one curve from among a charge curve or a discharge curve of the battery, Determining, for each battery, a label of belonging to the functional or defective category by comparing at least one measured curve with a reference curve characterizing the correct operation of the battery, Carrying out supervised training of a model for classifying a battery according to the two categories based on said groups of measurements and on said label of belonging to one of the two categories.

According to one particular aspect of the invention, the supervised training of the classification model is carried out by way of a random forest algorithm.

According to one particular aspect of the invention, the group of measurements characteristic of the operation of a battery comprises at least one measurement of an open-circuit voltage across the terminals of the battery, for example an average measurement over a predetermined time interval.

According to one particular aspect of the invention, the group of measurements characteristic of the operation of a battery comprises at least one measurement of a profile of a current flowing through the battery during a partial charge.

According to one particular aspect of the invention, the current profile is measured at at least one particular point from among a maximum current value and an end-of-partial-charge current value.

According to one particular aspect of the invention, the group of measurements characteristic of the operation of a battery comprises at least one measurement of a profile of a voltage across the terminals of the battery during relaxation of the battery following a partial charge.

According to one particular aspect of the invention, the voltage profile measurement comprises at least one estimate, performed through linear regression, of the slope of the voltage curve during discharging and/or measuring an end-of-relaxation potential.

According to one particular aspect of the invention, the group of measurements characteristic of the operation of a battery comprises at least one electrochemical impedance spectroscopy measurement carried out by exciting the battery with a signal at at least one predetermined frequency.

According to one particular aspect of the invention, electrochemical impedance spectroscopy measurement is carried out for at least two frequencies predetermined at 1000 Hz and 10 Hz.

According to one particular aspect of the invention, the group of measurements characteristic of the operation of a battery comprises at least one measurement of the position of a battery on a fabrication wafer.

According to one particular aspect of the invention, the batteries are Li-free solid batteries.

Another subject of the invention is a computer-implemented classification model obtained using the machine-learning method according to the invention.

Another subject of the invention is a method for testing a set of batteries comprising the following steps, for each battery:

Acquiring the same group of measurements used to train the classification model according to the invention, and Implementing the classification model according to the invention to determine, based on said group of measurements, whether the battery belongs to the functional or defective category.

Another subject of the invention is a computer program product comprising code instructions for implementing any one of the methods according to the invention.

Another subject of the invention is a device for testing a set of batteries, comprising a measurement apparatus and a computing device that are configured together to carry out the test method according to the invention.

BRIEF DESCRIPTION OF THE DRAWINGS

Other features and advantages of the present invention will become more apparent on reading the following description with reference to the following appended drawings.

FIG. 6 shows a database of measurements used at input of a learning method according to the invention.

DETAILED DESCRIPTION

Figure 1:
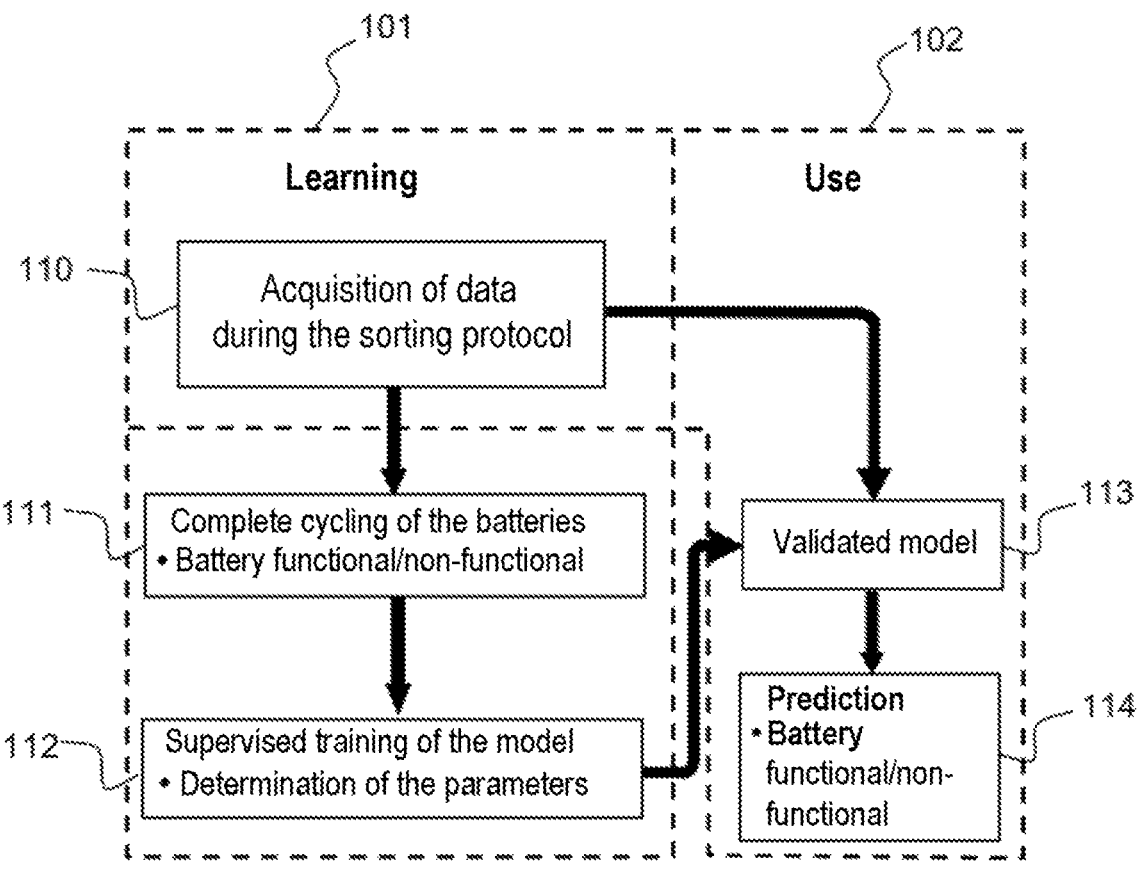
FIG. 1 shows a general diagram of the two-phase principle of the test method according to the invention.

FIG. 1 schematically shows a flowchart detailing the steps for implementing the invention, which comprises two separate phases: a first phase of learning 101 the classification model, carried out on a sample of multiple batteries, and a second phase of using 102 the trained and validated model to classify new manufactured batteries into two categories: functional battery or defective battery.

The learning phase 101 comprises a first step 110 of acquiring data, through measurements carried out on each battery, and then a step of completely cycling 111 the batteries, comprising at least one complete charge and/or one complete discharge of the battery. The complete cycling step 111 also comprises a charge and/or discharge profile measurement in order to characterize the battery as belonging to a functional or defective category. Based on the measurements acquired in step 110 and on the labelling into two categories carried out in step 111, a supervised machine classification model is trained, in step 112, to learn to classify a battery as functional or defective based on just the measurements carried out in step 110.

Once the classification model has been trained and validated, it is used, in the second phase 102, in order to be applied 113 directly to measurements carried out in step 110 on new manufactured batteries in order to classify them directly (step 114) into the functional or defective categories without having to completely cycle the battery.

Each of the steps of the method is now detailed.

Step 110 of collecting measurements of parameters representative of the correct operation of a battery is carried out both for the learning phase 101, on a given set of batteries, and in the use phase 102. One exemplary embodiment of step 110 that relates more particularly to microbatteries, in particular "Li-free" microbatteries, is detailed. Without departing from the scope of the invention, other parameters may be envisaged for characterizing the correct operation of a battery, in particular of another type.

For microbatteries in particular, the following measurements are envisaged to characterize the operating state thereof.

A first type of measurement relates to a measurement of the open-circuit voltage or OCV. This voltage is measured for a time interval, for example equal to a few seconds, as soon as the battery leaves the manufacturing process, before any electrical loading. The measured voltage values may be averaged over the measurement time interval. This voltage is measured directly across the terminals of the battery.

Figure 2:
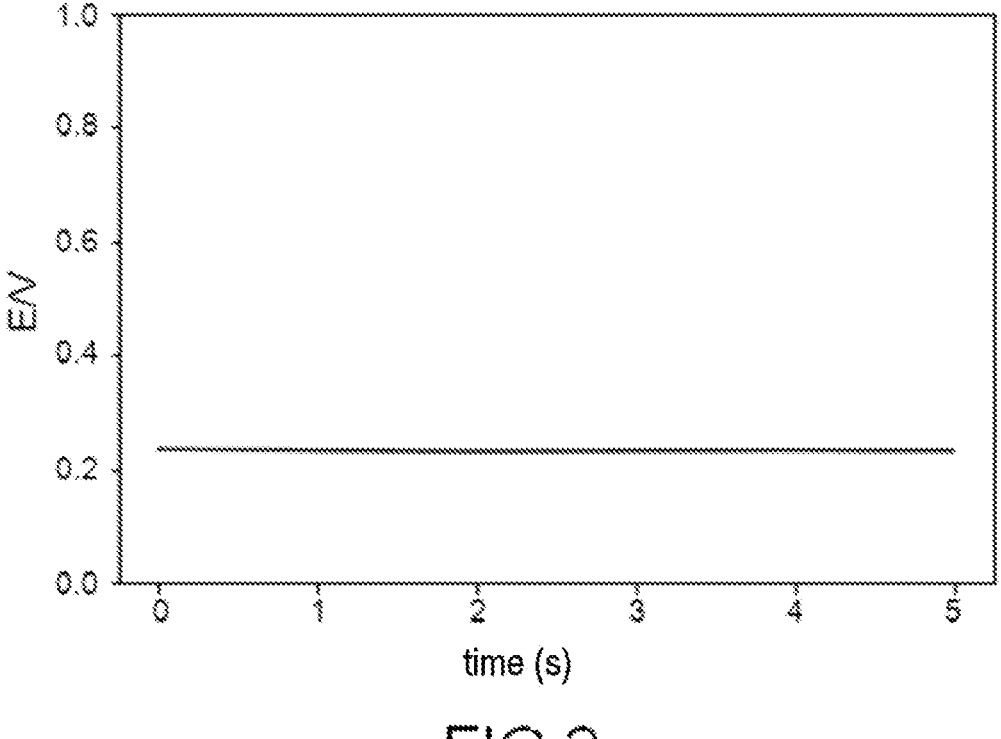
FIG. 2 shows a graph of a measurement of an open-circuit voltage across the terminals of a microbattery.

FIG. 2 illustrates one example of an open-circuit voltage measurement curve.

Figure 3:
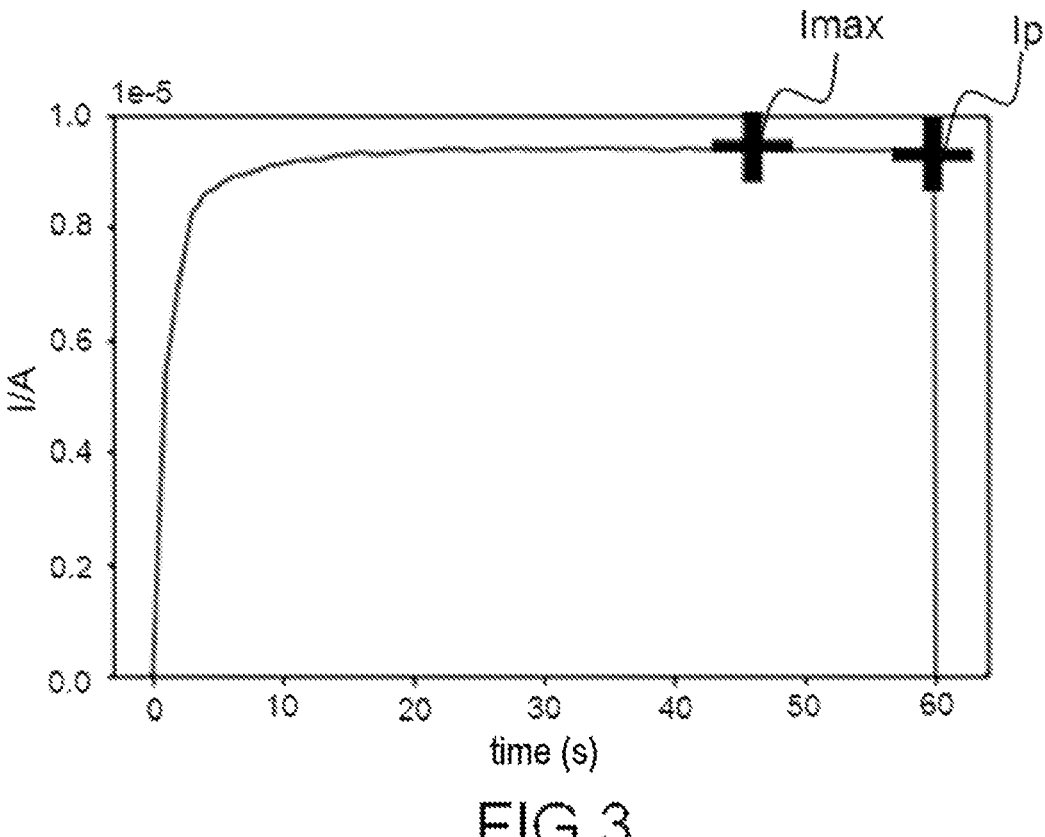
FIG. 3 shows a graph of a current profile during partial charging of a microbattery.

Another type of measurement relates to the current profile during a partial charge of the battery. For this purpose, a partial charge is initiated for a time interval, for example equal to 1 minute, by applying a predetermined voltage (for example equal to 4.2 V) across the terminals of the battery. During this time interval, the current flowing through the battery is then measured, and this gives a current evolution curve of the type shown in FIG. 3. This current profile may be used in its entirety or else certain characteristic points may be extracted therefrom, for example the maximum value of the current Imax or the end-of-charge current value Ip. Other points of the curve may also be envisaged.

Figure 4:
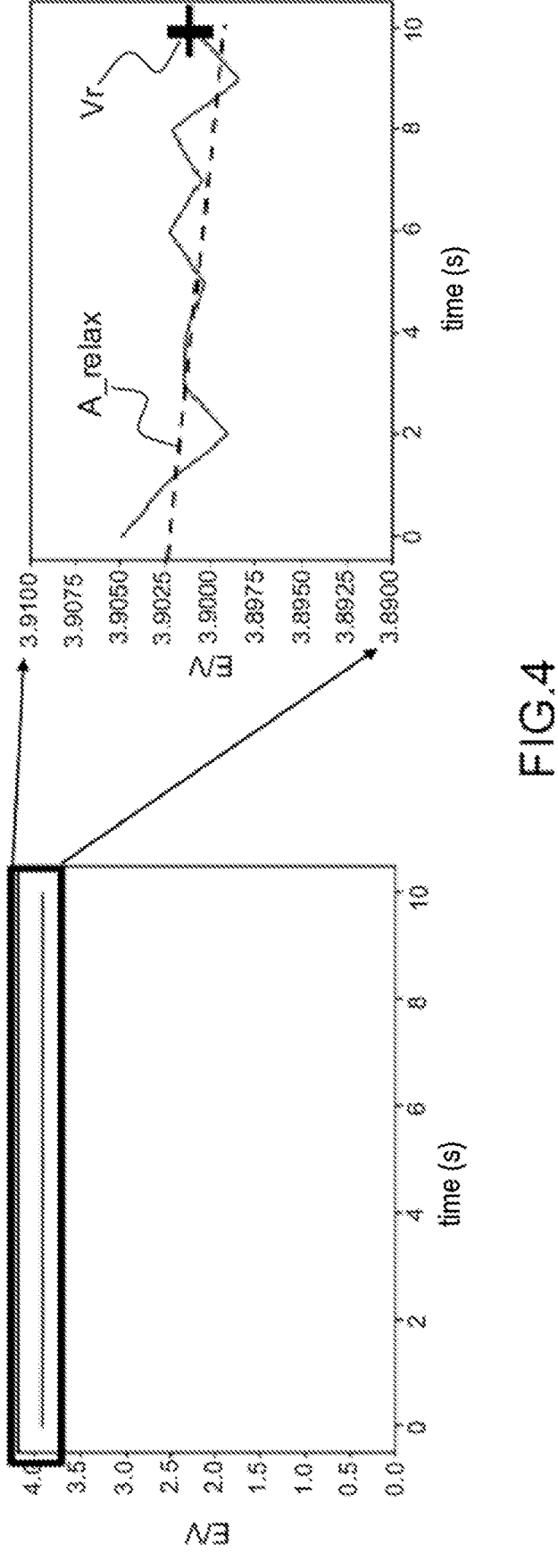
FIG. 4 shows a graph of a potential relaxation profile of a partially charged microbattery.

After the partial charging of the battery, the loading is stopped and the potential relaxation of the loaded battery may be ascertained by measuring the voltage across the terminals of the battery again for a given time interval. One example of such a measurement is shown in FIG. 4, with the complete curve on the left and a zoom-in on the amplitude of this curve on the right.

In this case too, certain characteristic points or parameters may be selected, such as the slope a_relax of the relaxation curve and the end-of-relaxation potential Vr.

Figure 5:
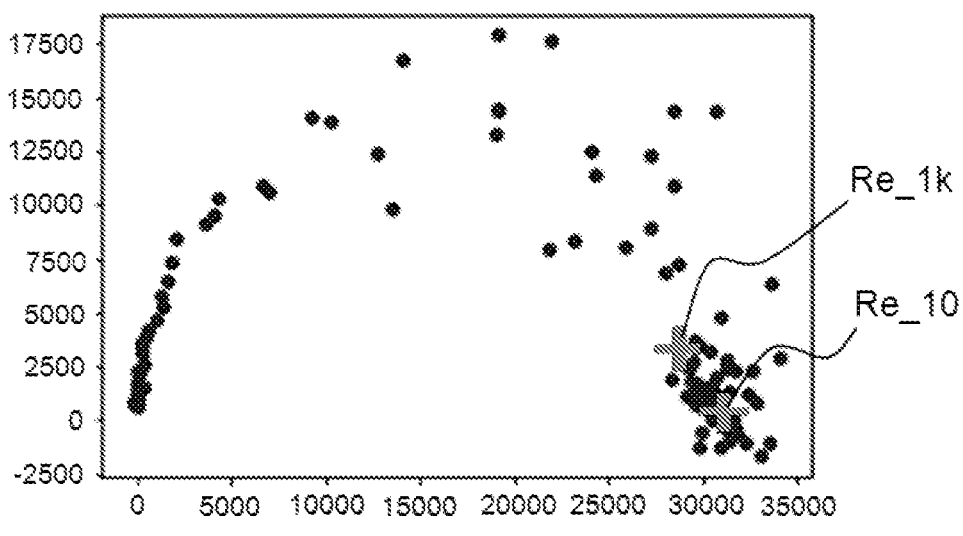
FIG. 5 shows a Nyquist plot of an electrochemical impedance of a microbattery as measured using spectroscopy for various frequencies.

Another type of measurement is an electrochemical impedance spectroscopy measurement, which may be carried out by loading the battery with a sinusoidal voltage the frequency of which varies within a given frequency range. FIG. 5 illustrates one example of a Nyquist plot of the measured electrochemical impedance, with the real part of the impedance on the abscissa and the opposite of the imaginary part of the impedance on the ordinate. Each point of the curve corresponds to a different excitation frequency.

All of the points on the curve may be selected or, advantageously, just certain characteristic points, for example the resistances Re_1 k, Re_10 measured at the frequencies 1 kHz and 10 Hz give a measurement of the internal resistance of the component and a measurement of the capacitive increase, respectively. These two measurement points are particularly relevant for assessing the correct operation of a microbattery.

In the case of microbatteries manufactured on silicon wafers, another collected datum is the position (x,y) of each component on the wafer.

Another collected datum relates to the manufacturing step at the end of which the test is carried out. In particular, the measurements may be carried out as soon as the three main elements of the battery, the positive electrode, the negative electrode and the contacts, have been manufactured. The measurements may notably be carried out before the manufacture of the encapsulation layers that protect the component from air and humidity.

Figure 6:
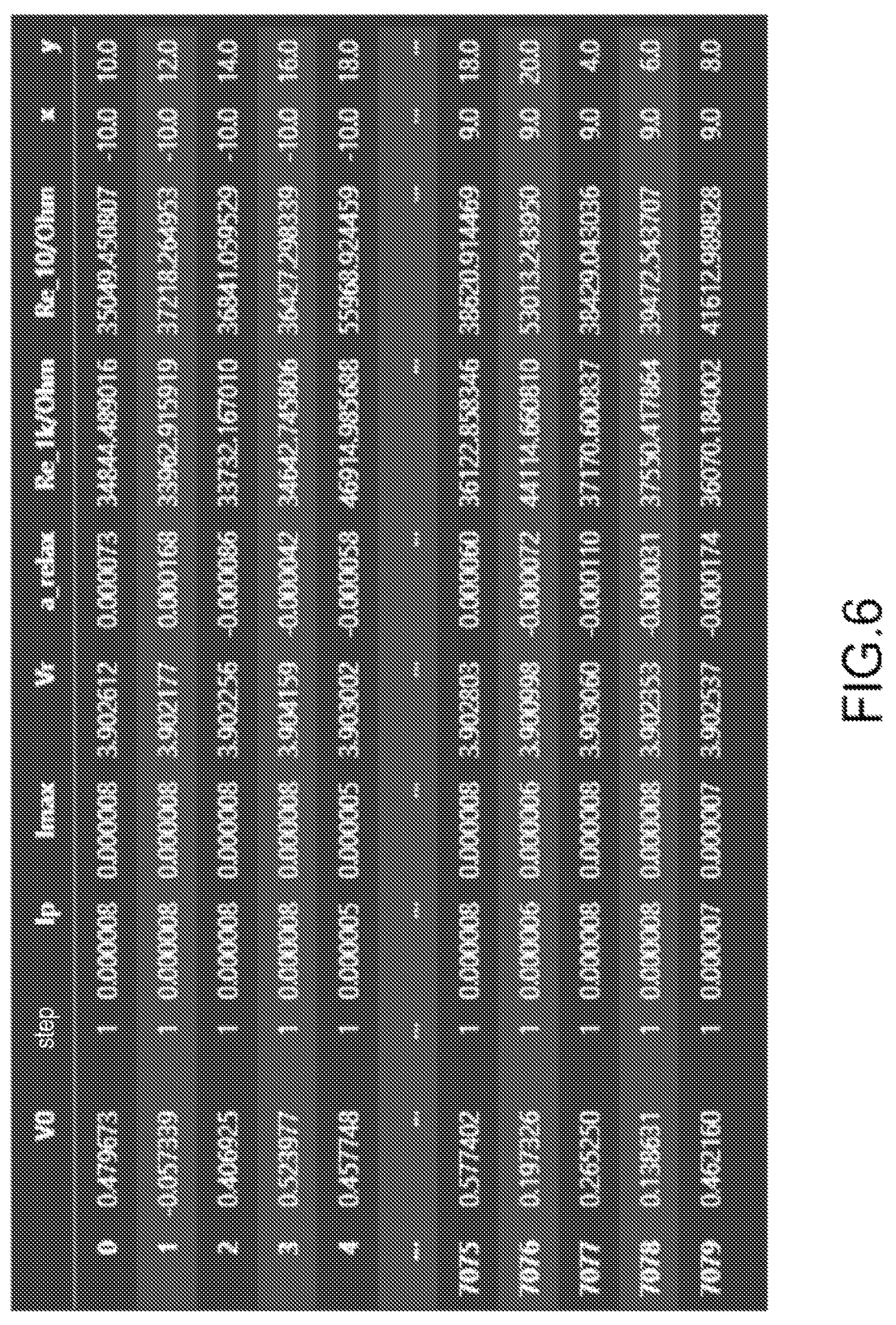

All of the collected measurements are compiled in a training database of the type described in FIG. 6, in which each row corresponds to a tested component and each column corresponds to one of the measured parameters.

Once all of the measurements have been carried out, the method moves to step 111, which consists in carrying out complete cycling of the batteries, comprising a complete charge and/or a complete discharge.

During the cycling, a charge curve and/or a discharge curve is measured. The charge curve is for example a charge capacity or current curve. The discharge curve is for example a discharge capacity or voltage curve.

For each battery, the one or more measured curves are compared with reference curves corresponding to a functional state of the battery, and this is used to deduce a classification of each battery into the functional category (if the measurements correspond to the reference curves) or into the defective category (if the measurements do not correspond to the reference curves).

This step corresponds to a step of annotating or labelling the training data with a view to carrying out learning on the classification model. It may be carried out manually or automatically.

Figure 7:
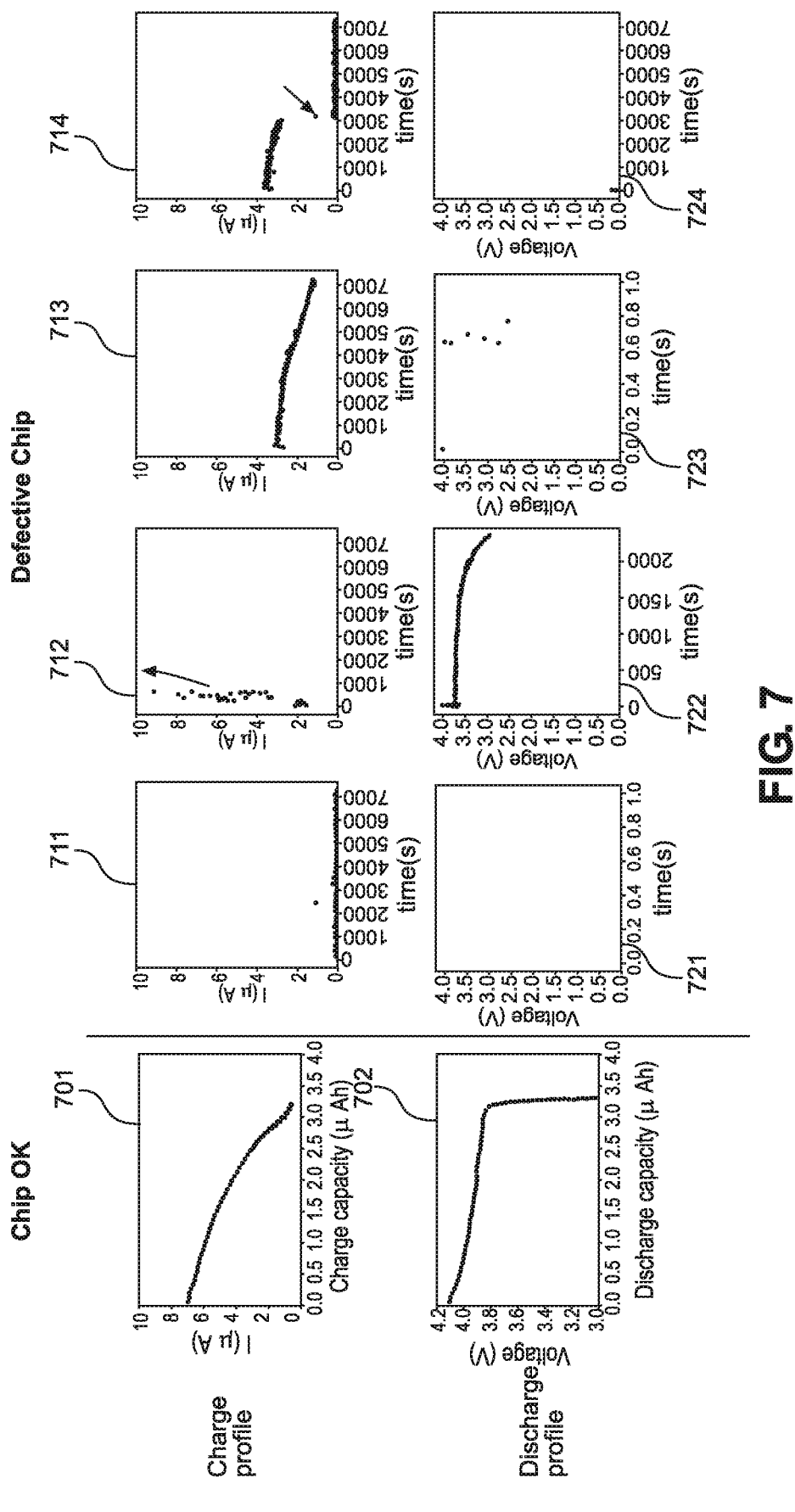
FIG. 7 shows a set of reference curves characterizing a functional microbattery and multiple examples of curves characterizing a defective microbattery.

FIG. 7 shows various curves of charge or discharge profiles of a microbattery for characterizing functional components and defective components.

FIG. 701 shows one example of a charge profile curve in the form of a curve of the variation of the strength of a charge current as a function of charge capacity. The current evolution profile decreases as a function of charge capacity.

FIG. 702 shows one example of a discharge profile curve in the form of a curve of the variation of the voltage across the terminals of the battery as a function of discharge capacity. The voltage evolution profile decreases as a function of discharge capacity.

FIGS. 711, 712, 713, 714 show various charge profiles measured for defective chips. FIGS. 721, 722, 723, 724 show the corresponding discharge profile curves. Curves 711, 721 correspond to an open-circuit defect for which no current is measured during charging and the voltage across the terminals of the battery is zero during discharging. Curves 712, 722 correspond to a defect related to an excessively high current during charging. The charge curve 712 is not compliant as the measured current is too high, while the discharge curve is partially compliant. Curves 713, 723 correspond to a low-efficiency defect for which the charging of the battery is compliant with what is expected but the discharging is non-existent. Lastly, curves 714, 724 correspond to a metal layer breakage defect for which the current experiences a sudden interruption during charging and no voltage is able to be measured during discharging.

Other examples of charge and/or discharge profiles corresponding to defective chips may exist without departing from the scope of the invention.

By comparing at least the charge curve and/or at least the discharge curve with the reference curves 701, 702, it is deduced therefrom whether the battery is functional or defective. The curves may be compared visually or automatically, for example by comparing some or all of the points of the curves with one another.

This gives, at the end of step 111, a training database containing, for each tested microbattery, all of the associated measurements carried out in step 110 and the category "functional" or "defective" determined in step 111.

Based on these training data, supervised training 112 is then carried out on a classification model, the purpose of which is to determine the category of a microbattery based only on the measurements carried out in step 110, and to do so without carrying out complete cycling of the battery.

The supervised training 112 may be carried out using any unsupervised training engine or algorithm. A description is given of one exemplary embodiment of this training implemented by way of a random forest algorithm. Other machine learning algorithms may be envisaged, for example deep neural networks.

The data obtained at the end of step 111 are separated into a training dataset and a validation dataset. The machine learning model implemented via a random forest decision tree algorithm is trained via the training data. The training consists in iteratively adjusting the parameters of the model in order to be able to predict the functionality category of the microbatteries as precisely as possible.

The algorithm consists in constructing multiple decision trees by iteratively adding successive nodes. Each node is associated with a decision rule to be tested against input data. One example of a decision rule consists in comparing a value of an input datum with a threshold.

During the training, each decision tree is constructed from a subset of the initial dataset that is of the same size as the initial dataset but that comprises randomly drawn and replaced samples. In other words, one and the same sample (corresponding to a battery) may be represented multiple times in the subset used for training.

For each decision rule, a cost is computed to evaluate the effectiveness of the rule for segmenting the data associated with the node into the targeted categories.

The cost of a node is for example computed by way of the Gini criterion:

$$GiniIndex = 1 - \sum_j p_j^2,$$

where $p_j$ is the probability of a battery associated with a node belonging to the category j, j being equal to 0 or 1 in the present case where only two categories are targeted.

Figure 8:
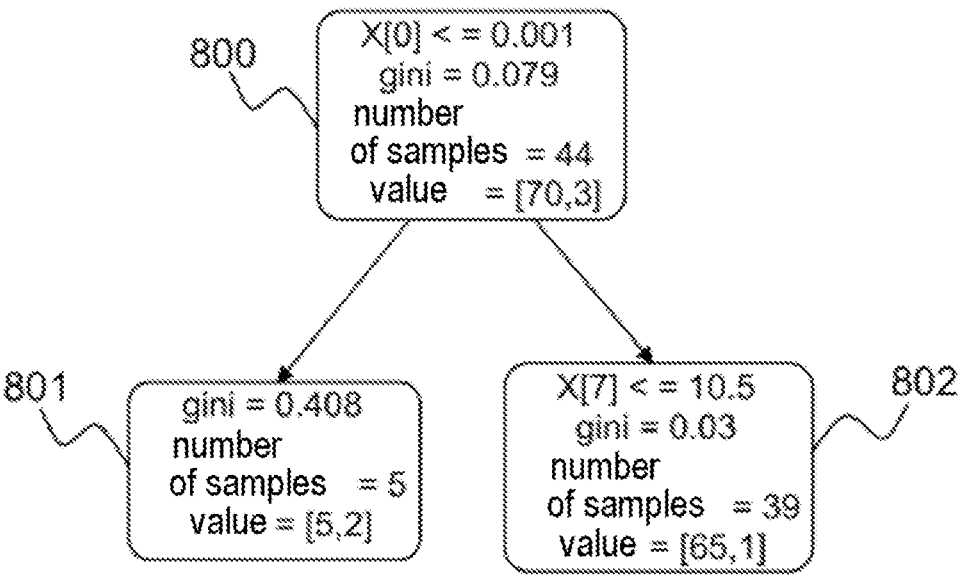
FIG. 8 illustrates a step of constructing a node during the generation of a tree via a random forest learning algorithm.

FIG. 8 illustrates one example of constructing successive nodes. The node 800 is associated with a rule for comparing the first datum X[0] (here the value of the open-circuit voltage) with a threshold value of −0.001 V.

For each node, the number of "unique" samples that satisfy the associated rule and the total number of samples (including the multiple samples) that belong to the two categories (defective or functional) is identified, this number being represented by the field "value=[x,y]", where x is the number of samples belonging to the detective category and y is the number of samples belonging to the functional category.

Picking up on the example of FIG. 8, among the 73 samples associated with the node 800, 7 do not satisfy the inequality of the node 800 and are associated with the node 801, while 66 satisfy the inequality of the node 800 and are associated with the node 802. Among the 73 samples of the node 800, only 44 are "unique" samples, the others being copies of these "unique" samples.

Among the 7 batteries that do not satisfy the inequality X[0]<=−0.001 (node 801), 5 batteries belong to the defective category and 2 batteries belong to the functional category. The population of each category is roughly equivalent and the computed Gini index is 0.408, which is relatively high knowing that the maximum value of this index is 0.5.

By contrast, among the 66 batteries that satisfy the inequality X[0]<=−0.001 (node 802), 65 belong to the defective category and just one belongs to the functional category, thereby leading to a low Gini index, equal to 0.03.

The cost of a rule is given by the following relationship:

$$J(k) = \frac{m_{left}}{m}G_{left} + \frac{m_{right}}{m}G_{right}$$

where J(k) is the cost of the node of rank k, m is the total population associated with the node, $m_{left}$, $G_{left}$, $m_{right}$ and $G_{right}$ are respectively the populations and Gini indices of the left and right sub-nodes created by the decision rule.

In the example above, the cost of the decision rule associated with the node 800 is therefore around 0.067. When training the model, for each rank, a large number of inequalities are tested randomly on all of the input data, and the one having the lowest cost is retained.

The construction of a new node of rank k+1 then continues restarting from the node, in this example the node 802, whose Gini index is lowest. Multiple criteria may be envisaged for continuing the construction of the following nodes:

The maximum depth, that is to say the maximum number of levels that a tree is able to have, The minimum number of samples from which a node is able to be divided into sub-nodes, and The minimum number of samples in each sub-node after a division. For example, if this number is taken to be equal to 5, a division will be considered only if it results in the creation of 2 sub-nodes each having at least 5 samples.

Figure 9:
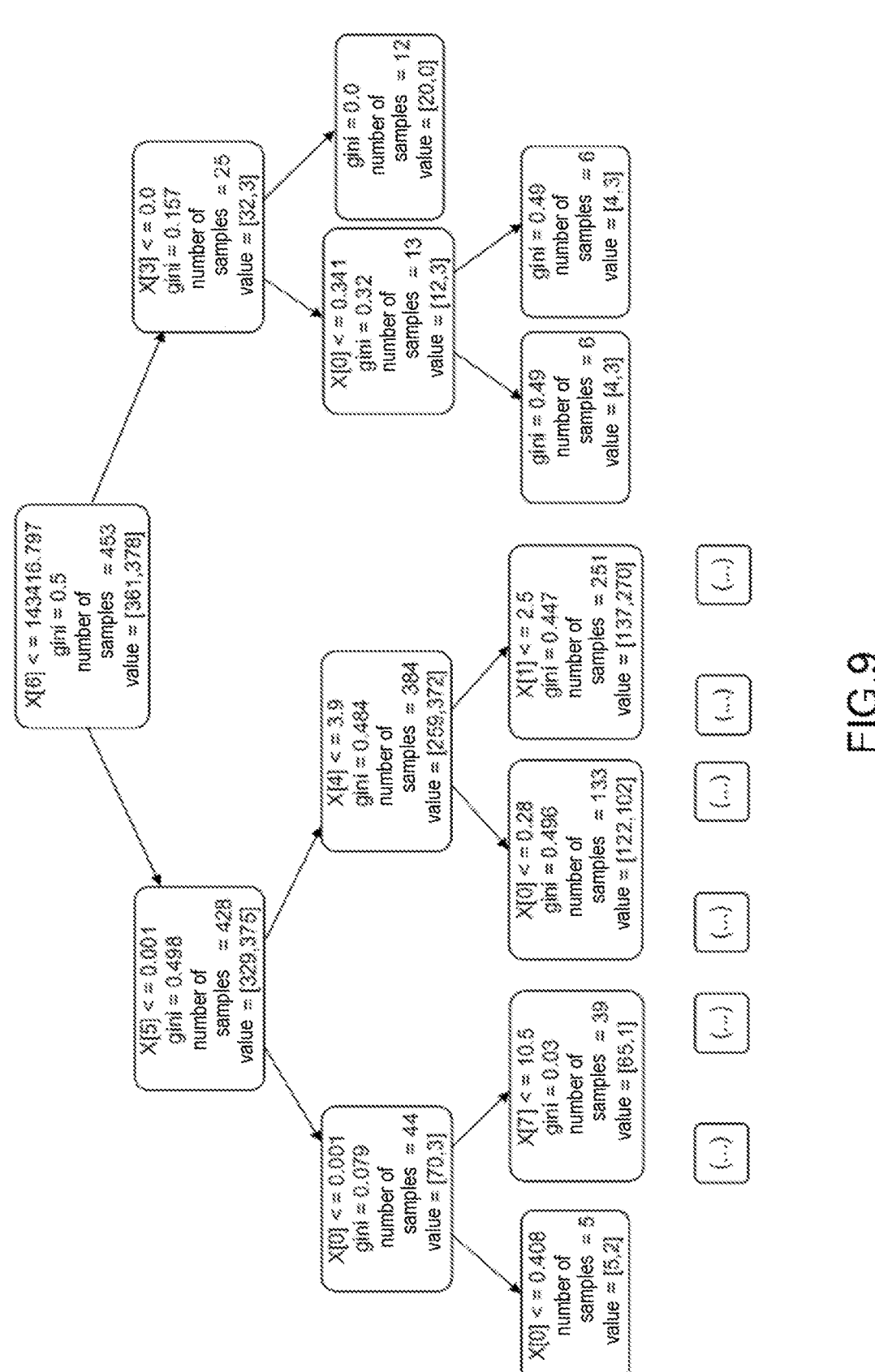
FIG. 9 shows one example of a tree generated by a random forest learning algorithm.

FIG. 9 shows a partial example of a tree that is obtained. The dashed nodes continue via other nodes that are not shown for the sake of clarity (the whole tree being too large). The final prediction of the tree is given by comparing the values measured for each battery with the inequalities of each node. Running through the tree from node to node arrives at a leaf node. Knowing the distribution of the categories for this leaf for the learning data, it is then possible to estimate a probability of belonging to one or the other of the categories, and the most probable category is assigned to the battery.

In other words, the category of belonging is the one for which the leaf node has the greatest number of samples during learning.

The random forest algorithm generates multiple trees of the type of FIG. 9 (of the order of one hundred for example) that are trained on all or some of the training data, so as to reduce the overfitting phenomenon. The final prediction of the model for a given battery is given by a majority vote expressed over all of the trees.

Optionally, the trained classification model may be evaluated on a validation dataset by computing a prediction score on the training data and a prediction score on the validation data in order to check whether the difference between the two scores is not too large. If this difference is too large, new learning may be carried out by modifying the parameters of the algorithm.

Once the classification model has been trained and validated, it is used directly in the use phase in step 114 to predict whether a new manufactured battery is functional or defective based only on the measurements 110 carried out on the battery without carrying out complete cycling.

Figure 10:
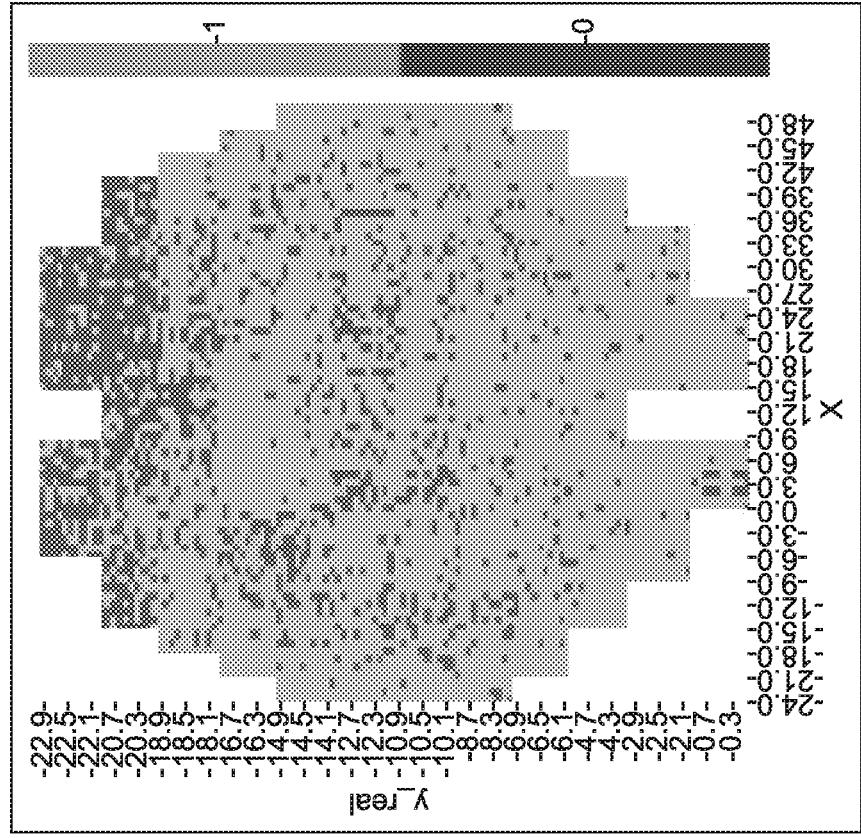
FIG. 10 shows two examples of classifying microbatteries produced on a silicon wafer and tested by way of the machine classification method according to the invention.
Figure 10:
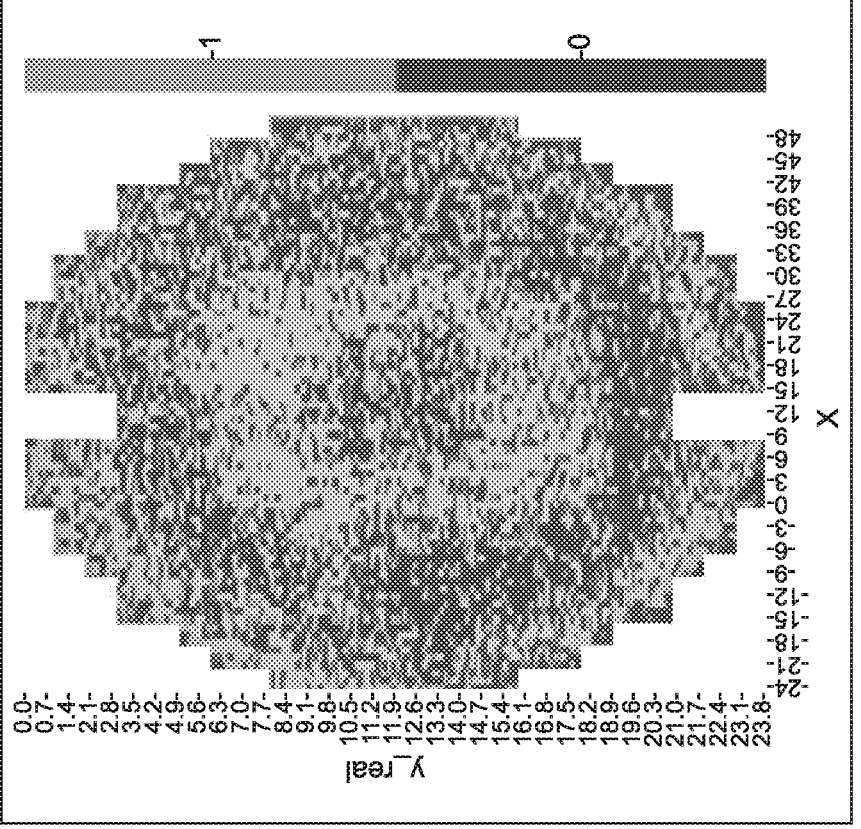

FIG. 10 shows one example of predictions obtained on the scale of a silicon wafer on which microbatteries are manufactured. Functional batteries are identified by the category '1', and defective batteries are identified by the category '0'.

Figure 11:
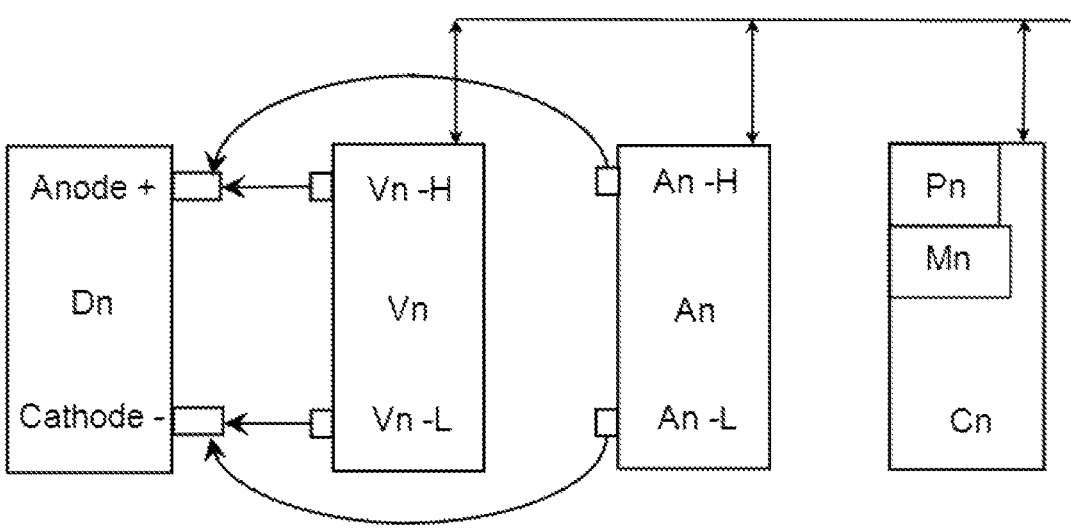
FIG. 11 shows a diagram of a device for testing batteries according to one embodiment of the invention.

FIG. 11 shows a diagram of a test system configured to implement the invention. To this end, FIG. 11 shows a battery Dn having an anode and a cathode, a programmable current generator An and a programmable voltmeter Vn that are connected to the terminals of the battery Dn in order to carry out the measurements needed in step 110 of the method according to the invention. The test system comprises a controller Cn in the form of a processing unit that receives the measurements carried out on the battery and implements the learning and the use of the classification model to predict the functional or defective state of the battery Dn. The controller Cn comprises at least one processor Pn and a memory Mn.

The invention may be implemented as a computer program comprising instructions for the execution thereof. The computer program may be recorded on a processor-readable recording medium.

The reference to a computer program that, when it is executed, performs any one of the functions described above is not limited to an application program running on a single host computer. On the contrary, the terms computer program and software are used here in a general sense to refer to any type of computer code (for example application software, firmware, microcode, or any other form of computer instruction) that may be used to program one or more processors to implement aspects of the techniques described here. The computing means or resources may notably be distributed ("Cloud computing"), possibly using peer-to-peer technologies. The software code may be executed on any suitable processor (for example a microprocessor) or processor core or a set of processors, be these provided in a single computing device or distributed among multiple computing devices (for example as possibly accessible in the environment of the device). The executable code of each program allowing the programmable device to implement the processes according to the invention may be stored for example in the hard drive or in read-only memory. Generally speaking, the one or more programs will be able to be loaded into one of the storage means of the device before being executed. The central processing unit is able to command and direct the execution of the software code portions or instructions of the one or more programs according to the invention, which instructions are stored in the hard drive or in the read-only memory or else in the other abovementioned storage elements.

The invention may be implemented on a computing device based for example on an embedded processor. The processor may be a generic processor, a specific processor, an application-specific integrated circuit (ASIC) or a field-programmable gate array (FPGA). The computing device may use one or more dedicated electronic circuits or a general-purpose circuit. The technique of the invention may be implemented on a reprogrammable computing machine (a processor or a microcontroller for example) executing a program comprising a sequence of instructions, or on a dedicated computing machine (for example a set of logic gates such as an FPGA or an ASIC, or any other hardware module).

The invention claimed is:

1. A method for supervised training of a machine learning model for classifying batteries into two categories: functional or defective, the method comprising the following steps of:

measuring, on a set of batteries of a same type, a group of measurements characteristic of an operation of a battery, executing a complete cycling of each battery of said set and measuring at least one curve from among a charge curve or a discharge curve of the battery, comparing at least one measured curve with a reference curve characterizing a correct operation of the battery, determining, for each battery, a label of belonging to a functional category or a defective category based on the comparison, executing, on a processor, a supervised training of a model for classifying a battery according to the two categories, the model receiving as input the groups of measurements and the label of belonging to one of the two categories, and providing the model for use in a manufacturing process of batteries.

2. The machine learning method according to claim 1, wherein the supervised training of the classification model is carried out by way of a random forest algorithm.

3. The machine learning method according to claim 1, wherein the group of measurements characteristic of the operation of a battery comprises at least one measurement of an open-circuit voltage across terminals of the battery.

4. The machine learning method according to claim 1, wherein the group of measurements characteristic of the operation of a battery comprises at least one measurement of a profile of a current flowing through the battery during a partial charge.

5. The machine learning method according to claim 4, wherein the current profile is measured with at least one particular point from among a maximum current value and an end-of-partial-charge current value.

6. The machine learning method according to claim 1, wherein the group of measurements characteristic of the operation of a battery comprises at least one measurement of a profile of a voltage across terminals of the battery during relaxation of the battery following a partial charge.

7. The machine learning method according to claim 6, wherein the voltage profile measurement comprises at least one estimate, performed through linear regression, of a slope of a voltage curve during discharging and/or measuring an end-of-relaxation potential.

8. The machine learning method according to claim 1, wherein the group of measurements characteristic of the operation of a battery comprises at least one electrochemical impedance spectroscopy measurement carried out by exciting the battery with a signal with at least one predetermined frequency.

9. The machine learning method according to claim 8, wherein the electrochemical impedance spectroscopy measurement is carried out for at least two frequencies predetermined at 1000 Hz and 10 Hz.

10. The machine learning method according to claim 1, wherein the group of measurements characteristic of the operation of a battery comprises at least one measurement of a position of a battery on a fabrication wafer.

11. The machine learning method according to claim 1, wherein the batteries are Li-free solid batteries.

12. A computer-implemented classification model trained using the machine learning method according to claim 1.

13. A method for testing a set of batteries comprising the classification model according to claim 12, the method for testing further comprising the following steps, for each battery:

receiving a battery to be tested in a manufacturing process, measuring, on the battery, the group of measurements, executing, on a processor, the trained classification model to determine, based on said group of measurements, whether the battery belongs to the functional or defective category, and if the battery belongs to the defective category, eliminating the battery from a manufacturing process.

14. A non-transitory computer-readable storage medium storing a computer program comprising code instructions for implementing the method according to claim 1.

15. A device for testing a set of batteries, comprising a measurement apparatus (Vn, An) and a computing device (Cn) that are configured together to execute the test method according to claim 13.

16. The machine learning method of claim 3 wherein the group of measurements characteristic of the operation of a battery comprises at least an average measurement over a predetermined time interval.

* * * * *